(12) United States Patent
Lim

(10) Patent No.: US 7,561,655 B2
(45) Date of Patent: Jul. 14, 2009

(54) SHIFT REGISTER CIRCUIT AND METHOD OF OPERATING THE SAME

(75) Inventor: Kyoung Moon Lim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 630 days.

(21) Appl. No.: 11/138,686

(22) Filed: May 27, 2005

(65) Prior Publication Data

US 2005/0264513 A1 Dec. 1, 2005

(30) Foreign Application Priority Data

May 31, 2004 (KR) .................. 10-2004-0038847

(51) Int. Cl.
*G11C 19/00* (2006.01)
*G09G 3/36* (2006.01)
(52) U.S. Cl. ...................... 377/64; 345/100
(58) Field of Classification Search ............. 345/100; 377/64, 73
See application file for complete search history.

(56) References Cited

U.S. PATENT DOCUMENTS 4,656,361 A * 4/1987 McIntyre ................ 348/301
4,800,534 A * 1/1989 Cornelissen ............. 365/184
5,392,229 A * 2/1995 Robertson ............... 708/210
6,525,710 B1 * 2/2003 Kwon ..................... 345/100

FOREIGN PATENT DOCUMENTS

WO    WO 03/034438    4/2003

OTHER PUBLICATIONS

CMOS Design Mode Summarization; Dec. 31, 1986.

* cited by examiner

*Primary Examiner*—Chanh Nguyen
*Assistant Examiner*—Calvin C Ma
(74) *Attorney, Agent, or Firm*—McKenna Long & Aldridge LLP

(57) ABSTRACT

A shift register circuit and a method of operating the same are disclosed. The shift register circuit includes an OR-gate unit for receiving a start pulse or an output of a previous stage and a feedback signal; a level shift unit for level-shifting a swing voltage of a clock signal in response to an output signal of the OR-gate unit; and a buffer for transferring an output of the level shift unit to a next stage as an input signal.

12 Claims, 6 Drawing Sheets

SHIFT REGISTER CIRCUIT AND METHOD OF OPERATING THE SAME

This application claims the benefit of Korean Patent Application No. 2004-38847, filed on May 31, 2004, which is hereby incorporated by reference for all purposes as if fully set forth herein.

BACKGROUND OF THE INVENTION

1. Field of the Invention

The present invention relates to a shift register circuit, and more particularly, to a shift register circuit in a driving circuit for a liquid crystal display device and a method of operating the same.

2. Discussion of the Related Art

Liquid crystal display (LCD) devices display images by controlling an amount of light passing through a liquid crystal layer using an electric field. An LCD device includes a liquid crystal display (LCD) panel having a plurality of liquid crystal cells arranged in a matrix configuration and a driving circuit to drive the LCD panel.

The LCD panel includes gate lines and data lines crossing each other, and the liquid crystal cells are arranged near the crossing points of the gate lines and the data lines. The LCD panel also includes a common electrode and pixel electrodes for supplying an electric field to each of the liquid crystal cells. Each of the pixel electrodes is connected to one of the data lines through a source terminal and a drain terminal of a thin film transistor (TFT) of a switching element, and a gate terminal of the TFT is connected to one of the gate lines.

The driving circuit includes a gate driver for driving the gate lines and a data driver for driving the data lines. The gate driver drives the liquid crystal cells of the LCD panel by sequentially supplying a scanning signal to the gate lines. The data driver supplies a video signal to each of the data lines when a scanning signal is supplied to one of the gate lines. Accordingly, the LCD device controls an amount of light passing through each liquid crystal cell by an electric field supplied between the pixel electrode and the common electrode according to a video signal, thereby displaying images.

The TFT used for the LCD device is classified as the amorphous silicon TFT or the poly-silicon TFT according to the material used for the semiconductor layer of the TFT.

The amorphous silicon TFT is stable because uniformity of amorphous silicon is comparatively superior. However, it is difficult to implement an LCD device with a high resolution using the amorphous silicon TFT because the mobility of the amorphous silicon TFT is comparatively low. In other words, when the amorphous silicon TFT is used for manufacturing an LCD device, peripheral driving circuits such as the gate driver and the data driver should be separately manufactured and installed into the LCD device, which increases the manufacturing cost.

By way of comparison, the poly-silicon TFT can be used for an LCD device with a high resolution because the poly-silicon TFT has a superior mobility of electric charge. Also, peripheral driving circuits can be embedded in a liquid crystal panel. Therefore, the manufacturing cost can be reduced. Accordingly, LCD devices using the poly-silicon TFT are becoming popular.

FIG. 1 is a block diagram illustrating an LCD device using a poly-silicon thin film transistor according to the related art.

Referring to FIG. 1, the LCD includes an image display unit 12; a LCD panel 10 having a data shift register 14, a gate shift register 16 and a sampling switch array 15; a printed circuit board (PCB) 20 having a control chip 22 integrated with a control circuit and a data drive integrated circuit (IC), and a level shifter array 24; and a flexible printed circuit (FPC) film 18 for electrically connecting the LCD panel 10 and the PCB 20.

The image display unit 12 displays an image through a plurality of liquid crystal cells arranged in a matrix configuration. Each of the liquid crystal cells includes a switching element, a poly-silicon TFT, located near the crossing points of gate lines (GL) and data lines (DL). Because the mobility of poly-silicon is about 100 times greater than that of amorphous silicon, the poly-silicon TFT has a fast response speed. As a result, the liquid crystal cells are driven by a dot sequential scheme.

The data lines (DL) receive video signals from the sampling switch array 15 driven by the data shift register 14 and the gate lines (GL) receive scan pulses from the gate shift register 16.

The data shift register 14 includes a plurality of stages, each of which has an output terminal connected to a sampling switch of the sampling switch array 15. The plurality of the stages are dependently coupled to each others, as illustrated in FIG. 2. Accordingly, each of the stages sequentially supplies a sampling signal to a sampling switch by shifting a source start pulse outputted from the control chip 22.

Referring to FIG. 2, each of the stages ST1 to STn is dependently connected to a source start pulse input line and is also connected to three clock signal supplying lines of four-phase clock signal supplying lines.

FIG. 3 shows an example of the four-phase clock signals C1 to C4 supplied to the plurality of the stages ST1 to STn. The data shift register shifts the start pulse SP by one clock using three clock signals of the four-phase clock signals C1 to C4. Output signals SO1 to SOn outputted from the stages ST1 to STn are supplied as a sampling signal and a start pulse of the immediately following stage.

The gate shift register 16 includes a plurality of stages, each of which has an output terminal connected to each of the gate lines. In a similar manner as described with respect to the data shift register 14, the plurality of stages in the gate shift register 16 are dependently coupled to each others and each of the stages supplies a scan pulse to one of the gate lines by shifting a start pulse outputted from the control chip 22.

The sampling switch array 15 includes a plurality of sampling switches (not shown), each of which has an output terminal connected to one of the data lines DL and is driven by a sampling signal from the data shift register 14. The sampling switch array 15 sequentially samples a video signal outputted from the control chip 22 in response to the sampling signal and supplies the sampling result to the data lines DL.

The data shift register 14, the sampling switch array 15 and the gate shift register 16 of the LCD panel 10 are formed by a similar process, because the poly-silicon transistors are used to construct them. The manufacturing cost of such an LCD device may be reduced by constructing the LCD panel 10 with an identical type of the poly-silicon TFT such as an NMOS or PMOS TFT instead of using a CMOS TFT.

When using the CMOS TFT, a wide range of operating voltage and high circuit integrity can be achieved because the CMOS TFT includes both P channel and N channel. However, manufacturing a LCD panel using the CMOS TFT requires many processes, thereby increasing the manufacturing cost and degrading the reliability. Accordingly, the PMOS or NMOS TFT is widely used to manufacture the LCD panel 10 to lower the manufacturing cost and provide a high reliability, as compared with the CMOS TFT.

A control circuit (not shown) included in the control chip 22 transfers externally supplied video data to the data driving IC (not shown) and provides driving control signals to the data shift register 14 and the gate shift register 15. The data driving IC (not shown) converts the video data inputted from the control circuit (not shown) to digital video data and supplies the digital video data to the sampling switch array 15 through the FPC film 18.

The level shifter array 24 amplifies a swing width (or swing voltage) of the driving control signals i.e., clock signals inputted from the control circuit and supplies the amplified driving control signals to the data shift register 14 and the gate shift register 16. For example, the level shifter array 24 level-shifts a clock signal having a swing voltage lower than 10V, which is generated from the control circuit, to a clock signal having a swing voltage greater than 10V including a negative voltage. This is because a clock signal having a swing voltage greater than 10V is required to drive the TFTs in the LCD panel 10. In other words, when the PMOS TFTs are used for the LCD panel 10, a driving control signal having a swing voltage greater than 10V including a negative voltage is required for driving the PMOS TFTs included in the sampling switch array 15 and the image display unit 12.

However, it is generally difficult to generate such a clock signal having a swing width greater than 10V including a negative voltage using an external chip such as the control chip 22. In other words, it is difficult to manufacture an integrated chip that can generate a clock signal having a swing width greater than 10 V or a negative voltage.

Accordingly, the level shifter array 24 according to the related art is manufactured as a separate chip and mounted on the PCB 20 for level-shifting the driving control signals inputted from the control chip 22. In such a case, the circuit structure on the PCB 20 becomes complicated and a large amount of electric power is consumed, because a clock signal having a swing voltage greater than 10V including both positive and negative voltages should be supplied from an external circuit to the data shift register 14 and the gate shift register 16 of the liquid crystal panel 10.

SUMMARY OF THE INVENTION

Accordingly, the present invention is directed to a shift register circuit and a method of operating the same that substantially obviate one or more problems due to limitations and disadvantages of the related art.

An advantage of the present invention is to provide a shift register circuit that consumes less electric power by using a clock signal having a low swing voltage inputted from an external circuit in order to reduce a driving load in a module, and a method of operating thereof.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the present invention, as embodied and broadly described herein, a shift register circuit includes an OR-gate unit for receiving a start pulse or an output of a previous stage and a feedback signal; a level shift unit for level-shifting a swing voltage of a clock signal in response to an output signal of the OR-gate unit; and a buffer for transferring an output of the level shift unit to a next stage as an input signal.

In another aspect of the present invention, a method of operating a shift register circuit includes inputting a start pulse or an output of a previous stage and a feedback signal to an OR-gate unit; defining an operating period by an output signal of the OR-gate unit and level-shifting a swing voltage of a clock signal by a level shift unit; and transferring an output of the level shift unit to a next state using a buffer.

In yet another aspect of the present invention, a display device includes an image display unit for displaying images and a control chip for generating a clock signal; and a shift register circuit electrically connected to the image display unit and the control chip, the shift register circuit including a level shift circuit for level-shifting a swing voltage of the clock signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
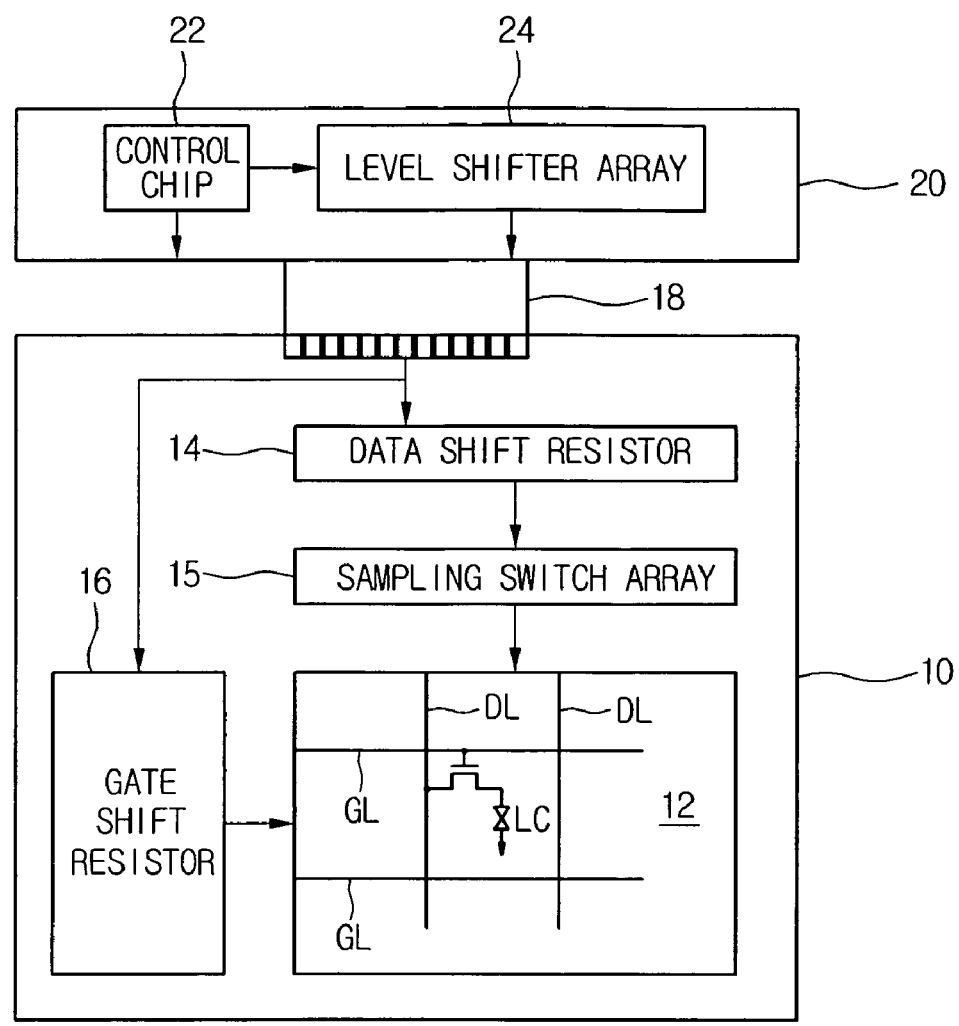
FIG. 1 is a block diagram illustrating a liquid crystal display device using a poly-silicon thin film transistor according to the related art.
Figure 2:
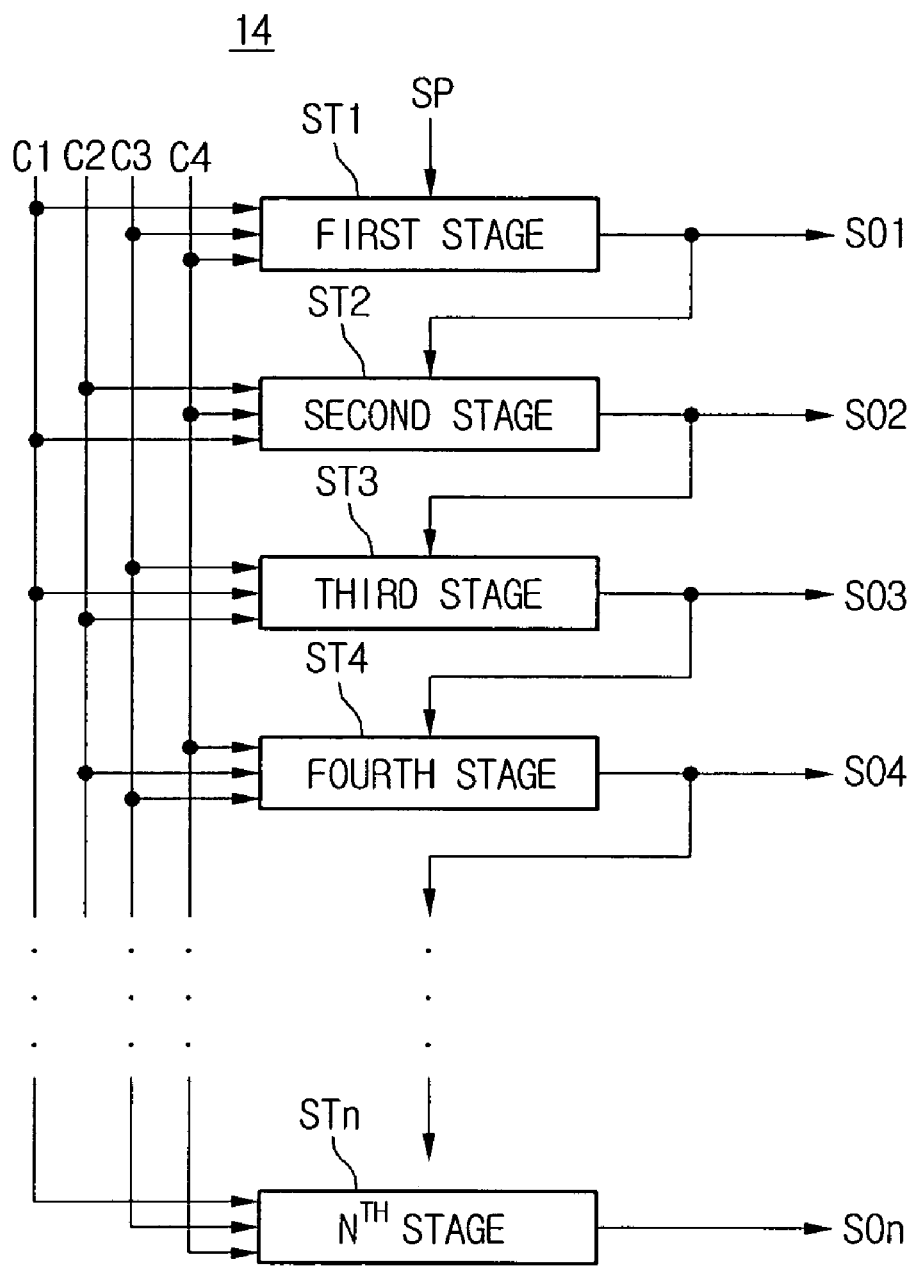
FIG. 2 is a block diagram illustrating the shift register illustrated in FIG. 1 in detail.
Figure 3:
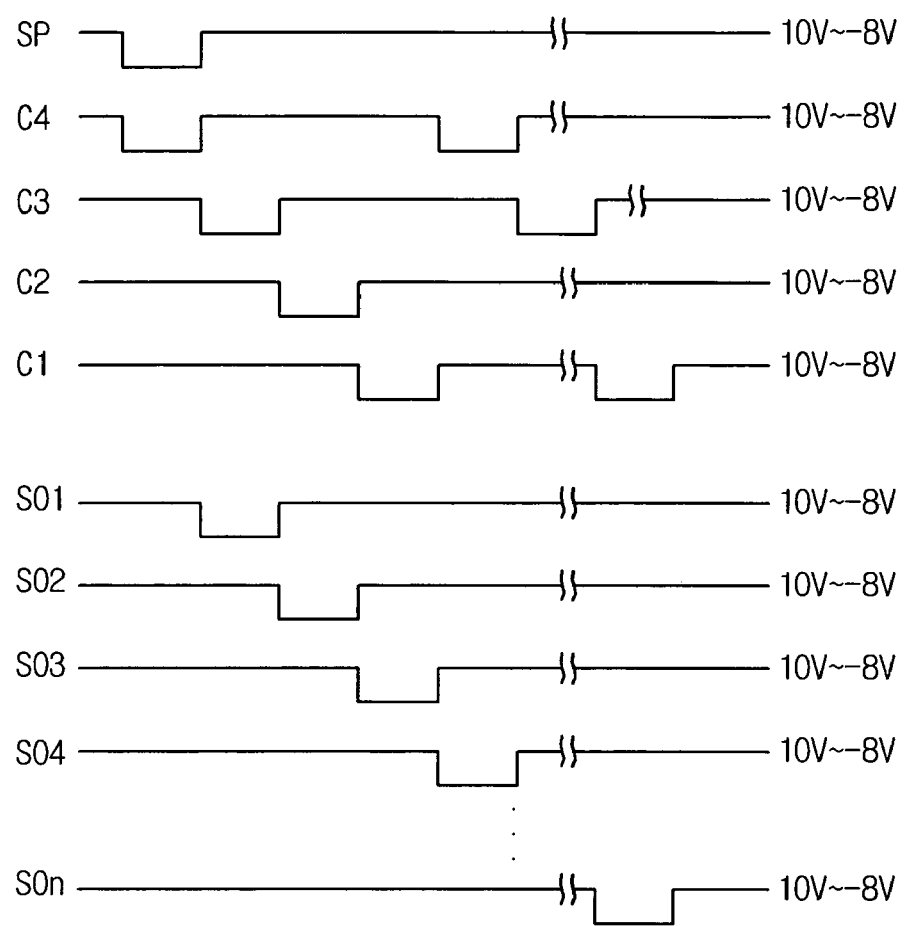
FIG. 3 is a graph illustrating wave forms of input/output signals of the shift register illustrated in FIG. 2.
Figure 4:
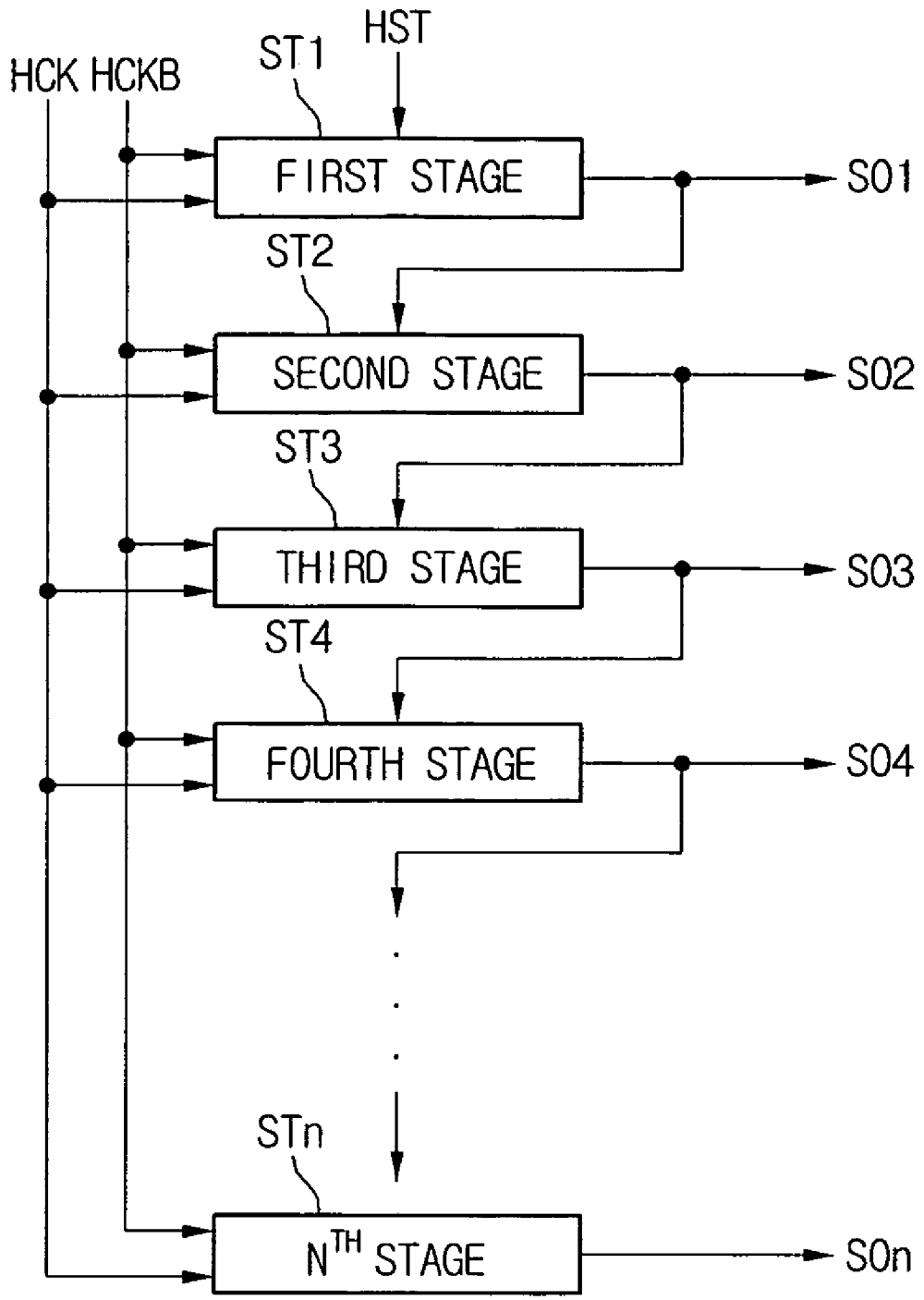
FIG. 4 is a block diagram illustrating a shift register according to an embodiment of the present invention.

FIG. 4 is a block diagram illustrating a shift register according to an embodiment of the present invention.

As illustrated in FIG. 4, the shift register includes a plurality of stages, each of which is connected to two-phase clock signal supplying lines HCK, HCKB. Each of the stages sequentially generates a sampling signal by shifting a predetermined input signal. That is, a first stage ST1 receives a start pulse HST and each of a second to $n^{th}$ stages ST2 to STn receives an output signal of the previous stage.

In more detail, the plurality of stages ST1 to STn are dependently connected to a start pulse input line and each stage is connected to the two-phase clock signal supplying lines HCK, HCKB. The two-phase clock signals HCK, HCKB are complementary to each other. Each of the stages ST1 to STn shifts the start pulse by one clock using the two-phase clock signals HCK, HCKB, and outputs the shifted start pulse. The output signals SO1 to SOn of the stages ST1 to STn serve as a sampling signal and a start pulse of the immediately following stage.

In the present embodiment, clock signals having a swing voltage lower than 10V inputted from an external circuit are used as the two-phase clock signals. In order to use such clock signals having a low swing voltage, a shift register includes a level shift circuit. The level shift circuit includes an OR gate such that it operates when all input signals including a feedback signal have a high state. Therefore, unnecessary consumption of electric power can be minimized or prevented.

Figure 5:
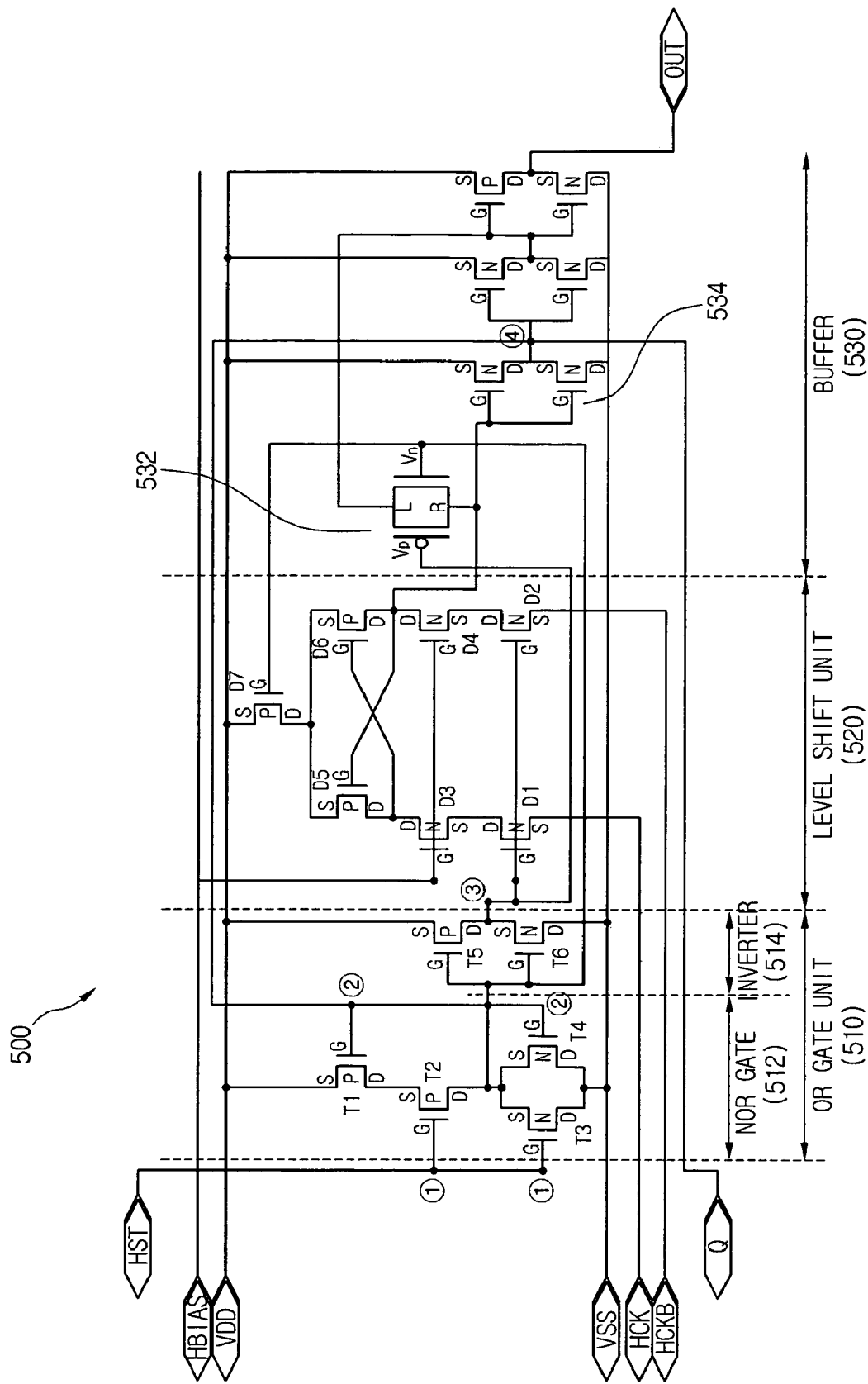
FIG. 5 is a diagram illustrating a shift register circuit included in each stage of the shift register illustrated in FIG. 4.
Figure 6:
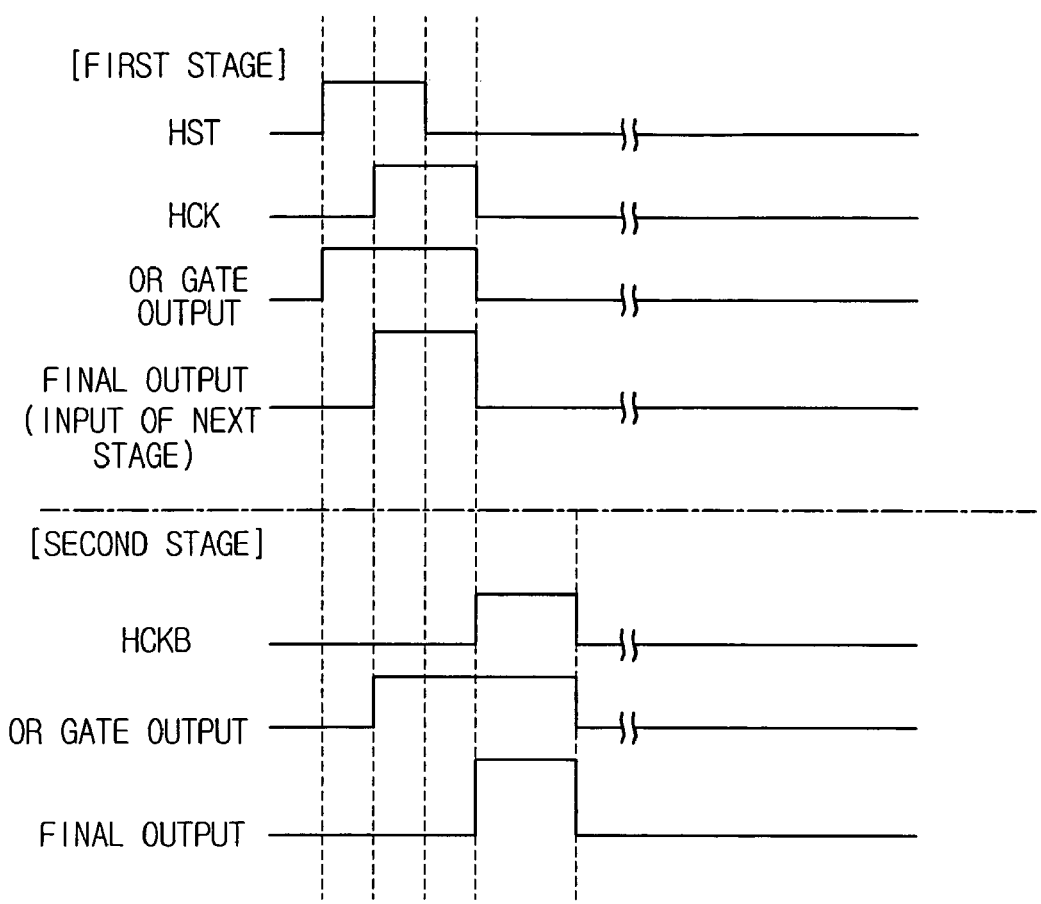
FIG. 6 is a graph illustrating wave forms of input/output signals of the shift register circuit illustrated in FIG. 5.

FIG. 5 is a diagram illustrating a shift register circuit included in each stage of the shift register illustrated in FIG. 4, and FIG. 6 is a graph showing wave forms of input/output signals of the shift register circuit shown in FIG. 5. In order to explain the operation of the shift register circuit, only the first stage receiving the start pulse (HST) and the second stage connected to the first stage will be described as an example.

Referring to FIG. 5, a shift register circuit 500 includes an OR gate unit 510 that receives a start pulse and a feedback clock signal, a level shift unit 520 operated by an output signal of the OR gate 510 and a buffer 530 for generating a sampling signal and transferring an output of the level shift unit 520 to the next stage.

In the present embodiment, the two-phase clock signals HCK, HCKB having a swing voltage lower than 10V, which are inputted from an external circuit, can be used to drive the shift register circuit 500 in which the level shift unit 520 controlled by the OR gate unit 510 operates during a specific period of time, thereby reducing consumption of electric power. In addition, because the level shift circuit is included in the shift register circuit inputted with two-phase clock signals having a low swing voltage, a compact display device can be realized.

Hereinafter, the shift register circuit having the OR gate 510, the level shift unit 520 and the buffer 530 and a method of operating the same will be explained with reference to FIGS. 5 and 6.

The OR gate 510 includes an NOR gate circuit 512 and an inverter circuit 514 connected to the NOR gate circuit 512 in serial. The NOR gate circuit 512 includes two PMOS transistors T1, T2, and two NMOS transistors T3, T4. The two PMOS transistors T1, T2 and the two NMOS transistors T3, T4 are serially connected. The two PMOS transistors T1 and T2 are serially connected and the two NMOS transistors T3 and T4 are connected in parallel. An output of the NOR gate circuit 512 is connected to the inverter circuit 514 including an NMOS transistor T5 and a PMOS transistor T6.

Input signals of the OR gate unit 510 are the start pulse HST inputted to the first stage or an output signal of the previous stage and a feedback signal. The feedback signal is a signal (IV) outputted from a first inverter in the buffer 530 after the two-phase clock signals HCK, HCKB are inputted to the level shift unit 520, as illustrated in FIG. 5. The feedback signal is feed-backed (II) to the T1 and the T4 of the NOR gate. That is, the feedback signal (II) is inputted to the T1 and the T4 and the start pulse (HST) (I) is inputted to the T2 and T3. Finally, an output (III) of the OR gate is generated through the inverter circuit 514 having the T5 and T6.

The OR gate unit outputs "high" except when all the input signals are "low." Therefore, the OR gate unit generates an output wave form shown in FIG. 6. That is, the OR gate unit outputs "high" when the start pulse (HST) is "high" or the feedback clock signal is "high". The output (III) of the OR gate unit 510 determines a duration of a time period during which the level shift unit 520 operates (operating period).

Because a gate electrode of an NMOS transistor D1 is connected to an output terminal of the OR gate unit 510, the level shift unit 520 does not operate when the gate electrode of the NMOS transistor D1 is not turned ON. Thus, the NMOS transistor D1 decides the operating period of the level shift unit 520. Accordingly, the level shift unit 520 only operates when the OR gate unit 510 outputs "high". As described above, because the OR gate unit 510 controls the operating period of the level shift unit 520, unnecessary power consumption can be minimized or prevented.

The level shift unit 520 converts a clock signal having a swing voltage lower than 10V to a clock signal having a swing voltage greater than 10V. This is because a clock signal having a swing voltage greater than 10V should be supplied to drive TFTs in the LCD panel.

According to the related art, the level shift unit is manufactured as a separated chip and the chip is mounted on the PCB, thereby complicating the circuit structure on the PCB. In addition, because a clock signal having a swing width greater than 10 V including positive and negative voltages should be provided to the shift register of the LCD panel from an external circuit, a large amount of electric power is consumed.

However, in the present embodiment, the level shift unit 520 is included in the shift register circuit 500 and only operates during a predetermined period of time. Therefore, unnecessary electric power consumption can be minimized or prevented.

The level shift unit 520 includes a plurality of NMOS transistors D1 to D4 and PMOS transistor D5 to D7, as illustrated in FIG. 5. For stable operation of the level shift unit 520, a constant bias voltage HBIAS, i.e., 5V is applied to the D3 and D4.

However, the level shifter unit is not limited by the configuration illustrated in FIG. 5 and the level shifter unit can be embodied with various configurations to provide the same result.

The level shift unit 520 level-shifts the clock signal inputted to the D1 or D2 only during a predetermined period of time in response to the OR gate unit 510. That is, a clock signal having a swing width lower than 10V is level-shifted to a clock signal having a swing width greater than 10V which is shown in FIG. 6.

The output of the level shift unit 520 is inputted to the buffer 530 through a pass circuit 532. The buffer 530 includes three inverter circuits connected in a cascade form and an output of the first inverter circuit 510 is feed-backed to the T1 and the T4 of the OR gate-unit 510. The final output signal of the buffer 530 is inputted to a sampling circuit and the next stage as a start pulse HST.

As shown in FIG. 6, the clock signal HCKB inputted to the second stage is level-shifted and the second stage outputs its final output signal using the output signal of the first stage and the feedback clock signal in the same manner described above. Then, the output signal of the second stage is inputted to the third stage as a start pulse.

In the present embodiment, the shift register circuit uses a clock signal having a low swing voltage inputted from an external circuit and includes the level shift circuit which only operates during a predetermined period of time, thereby reducing the operation load of the driving circuit and the electric power consumption. In addition, because the shift register circuit including the level shift circuit is inputted with two-phase clock signals having a low swing voltage, a compact display device can be realized.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A shift register circuit, comprising:
   an OR-gate unit for receiving a start pulse or an output of a previous stage and a feedback signal;
   a level shift unit for level-shifting a swing voltage of a clock signal in response to an output signal of an inverter circuit of the OR-gate unit; and
   a buffer for transferring an output of the level shift unit to a next stage as an input signal,
   wherein the OR-gate unit includes an NOR-gate circuit and an inverter circuit serially connected to the NOR-gate circuit,
   wherein the NOR-gate circuit includes two PMOS transistors (T1, T2) connected in serial and two NMOS transistors (T3, T4) connected in parallel which are connected to the two PMOS transistors in serial, and the inverter circuit includes an NMOS transistor (T5) and a PMOS transistor (T6), and
   wherein the level shift unit includes a plurality of NMOS transistors and a plurality of PMOS transistors, and a predetermined bias voltage is additionally applied to the level shift unit.

2. The shift register circuit according to claim 1, wherein the clock signal is one of two-phase clock signals and the two-phase clock signals are complementary to each other.

3. The shift register circuit according to claim 2, wherein the two-phase clock signals have a swing voltage lower than 10V and are inputted from an external circuit.

4. The shift register circuit according to claim 1, wherein the feedback signal is a signal outputted from a first inverter in the buffer after the clock signal is inputted to the level shift unit.

5. The shift register circuit according to claim 1, wherein the output signal of the OR-gate unit is generated by inputting the feedback signal to the T1 and T4, inputting the start pulse to T2 and T3, and passing the outputs through the T5 and T6.

6. The shift register circuit according to claim 1, wherein the level shift unit operates only when the OR-gate unit generates a high state.

7. The shift register circuit according to claim 1, wherein the buffer includes a plurality of inverter circuits connected in a cascade form and an output of a first inverter circuit is feed-backed to a transistor of the OR-gate unit.

8. A method of operating a shift register circuit, comprising:
   inputting a start pulse or an output of a previous stage and a feedback signal to an OR-gate unit;
   defining an operating period by an output signal of the OR-gate unit and level-shifting a swing voltage of a clock signal by a level shift unit; and
   transferring an output of the level shift unit to a next state using a buffer, wherein the OR-gate unit includes an NOR-gate circuit and an inverter circuit serially connected to the NOR-gate circuit,
   wherein the NOR-gate circuit includes two PMOS transistors (T1, T2) connected in serial and two NMOS transistors (T3, T4) connected in parallel which are connected to the two PMOS transistors in serial, and the inverter circuit includes an NMOS transistor (T5) and a PMOS transistor (T6), and
   wherein the level shift unit includes a plurality of NMOS transistors and a plurality of PMOS transistors, and a predetermined bias voltage is additionally applied to the level shift unit.

9. The method according to claim 8, wherein the clock signal is one of two-phase clock signals and the two-phase clock signals are complementary to each other.

10. The method according to claim 9, wherein the two-phase clock signals have a swing voltage lower than 10V and are inputted from an external circuit.

11. The method according to claim 8, wherein the feedback signal is a signal outputted from a first inverter in the buffer after the clock signal is inputted to the level shift unit.

12. The method according to claim 8, wherein the level shift unit operates only when the OR-gate unit generates a high state.

* * * * *